United States Patent [19]
Wang et al.

[11] Patent Number: 5,266,503
[45] Date of Patent: Nov. 30, 1993

[54] METHOD OF MAKING A SURFACE EMITTING LASER WITH OXYGEN ION IMPLANTS FOLLOWED BY EPITAXIAL REGROWTH

[75] Inventors: Shih-Yuan Wang, Palo Alto; Michael R. T. Tan, Mountain View, both of Calif.

[73] Assignee: Hewlett-Packard Company, Palo Alto, Calif.

[21] Appl. No.: 771,069

[22] Filed: Oct. 2, 1991

Related U.S. Application Data

[63] Continuation-in-part of Ser. No. 342,771, Apr. 24, 1989, Pat. No. 5,160,492.

[51] Int. Cl.$^5$ .............................................. H01L 21/76
[52] U.S. Cl. ........................................ 437/24; 437/26; 437/61; 437/67; 437/22; 148/DIG. 95
[58] Field of Search ............... 148/DIG. 50, DIG. 85, 148/DIG. 86, DIG. 95; 437/24, 26, 62, 67, 68, 61, 22

[56] References Cited

U.S. PATENT DOCUMENTS

| | | | |
|---|---|---|---|
| 4,115,150 | 9/1978 | Dyment | 437/22 |
| 4,124,826 | 11/1978 | Dixon et al. | 437/24 |
| 4,523,961 | 6/1985 | Hartman et al. | 437/24 |
| 4,871,690 | 10/1989 | Holonyak, Jr. et al. | 437/24 |
| 5,013,684 | 5/1991 | Epler et al. | 437/129 |

*Primary Examiner*—George Fourson

[57] ABSTRACT

A surface emitting laser diode device is disclosed where an active layer is implanted with oxygen ions except for a small active region. The active region includes a pn junction for generating radiation in response to passage of electrical current therethrough. After the oxygen implantation, mirror layers are grown on top of the active layer to reflect light generated in the active region back into the active region to induce more radiation emission. Mirror layers are also provided underneath the active region for the same purpose. Contact layers are provided on the top and bottom of the structure just described so that when an electrical potential is applied between the two contacts, electrical current will flow between the contacts between the active region for generating radiation. The oxygen-implanted isolation region surrounds the active region in order to confine current flow to the active region.

5 Claims, 2 Drawing Sheets

METHOD OF MAKING A SURFACE EMITTING LASER WITH OXYGEN ION IMPLANTS FOLLOWED BY EPITAXIAL REGROWTH

CROSS-REFERENCE TO RELATED APPLICATION

This application is a continuation-in-part of U.S. patent application Ser. No. 07/342,771, filed Apr. 24, 1989 now U.S. Pat. No. 5,160,492, issued Nov. 3, 1992.

BACKGROUND OF THE INVENTION

This invention relates in general to semiconductor lasers and in particular to surface emitting semiconductor lasers.

Surface emitting semiconductor lasers are advantageous over other types of semiconductor lasers for a number of reasons. In the surface emitting semiconductor laser diode device, radiation is emitted typically through one or more holes in the metal contacts of the laser diode device. This is particularly advantageous where the light emitted from the laser is to be coupled to a single mode optical fiber. The shape and size of the hole through which light is coupled to the fiber can be made to conform to the shape and size of the fiber so that less light will be diffracted. In the case of an edge laser, however, light is emitted typically through an elongated area (e.g., one micron by 0.1 micron). When light emitted from such an elongated area is coupled to a single-mode fiber, much of the light emitted will be diffracted and lost. The quality of radiation transmitted by a surface emitting laser diode device is also better than light emitted by an edge laser diode device. Furthermore, surface emitting laser devices are easier to manufacture than edge laser devices since surface emitting laser devices can be tested upon fabrication of the semiconductor wafer; the wafer need not be cut into individual diode devices before the laser diode devices thereon can be tested. In the case of edge lasers, however, no testing of the laser diode devices can be performed until each individual laser diode device has been cleaved from the wafer.

One type of surface emitting laser is described by Tai, et al., in an article, "Room Temperature Continuous Wave Vertical Cavity Surface Emitting GaAs Injection Lasers," *Optical Fiber Communication Conference*, Paper TUC3, 1990. In the surface emitting semiconductor laser device disclosed by Tai, an active light emitting layer is sandwiched between two groups of mirror layers for reflecting light back into the active layer to induce more light emission. Part of the light generated in the active layer is transmitted through one group of mirror layers and escapes through a hole in the substrate, and a hole in a metal contact attached to the substrate.

Light emission from the active layer is generated by passage of current there through between the two metal contacts in FIG. 1 of Tai, et al. When current is passed through the active layer, the recombination of charge carriers in the active layer causes light to be generated. To improve lasing efficiency, or in some circumstances to cause lasing action at all, it is necessary to confine the current flow between the two metal contacts to a small area of the active layer. Tai, et al. proposed the use of an insulating ring region in one of the two groups of mirror layers in order to insulate one of the metal contacts from the active layer except through a small region of the one group of mirror layers, where the region is surrounded by the ring region and is aligned with a hole in the substrate and a hole in the metal contact on the other side of the laser device. This causes current flow to be confined to a small region of the active layer aligned with a small area of the mirror layers surrounded by the insulating ring. Tai et al.'s structure does not, however, have any structure in the active layer to restrict current flow.

From the above, it is evident that Tai, et al.'s device is not entirely satisfactory. Therefore, it is desirable to provide an improved surface emitting semiconductor device in which the above-described disadvantages are not present.

SUMMARY OF THE INVENTION

This invention is based on the observation that the confinement of current flow to a small region in the active layer can be achieved by means of oxygen ion implantation into the active layer to create an insulating isolation region in the active layer surrounding a small unimplanted area which becomes the active region of the active layer. The oxygen ion implantation is followed by epitaxial regrowth of the semiconductor structure to complete the fabrication of the surface emitting laser device.

The apparatus of this invention is directed towards a surface emitting semiconductor laser device which comprises a first semiconductor layer having an active region surrounded by an isolation region. The active region generates substantially monochromatic and coherent radiation in response to passage of current through the active region. The isolation region has oxygen ions implanted therein to prevent current flow therethrough. The device further comprises at least two mirror semiconductor layers, one on each side of said first layer for reflecting at least some of the radiation generated in the active region back into the active region. The first layer and mirror layers form a portion of a semiconductor body. The device further includes contact layers on both side of the body, and electrically connected to said mirror layers, so that when a current is applied to the active region through the contact layers, the active region will generate substantially monochromatic and coherent radiation. At least one of the contact layers defines a hole therein at least a portion of which being aligned with the active region to permit transmission therethrough of radiation transmitted through a mirror layer and generated in the active region.

One aspect of the invention is directed towards a method for fabricating a surface emitting semiconductor laser device. A mirror layer is grown epitaxially on the substrate. On top of the mirror layer is grown an active radiation generating layer which generates substantially monochromatic and coherent radiation in response to passage of current through the layer. Oxygen ions are then implanted in the active layer in regions surrounding an active region of the active layer, thereby forming an electrically insulating isolation region surrounding said active region to confine current flow through said active layer to said active region. A second mirror semiconductor layer is grown on the active layer. The mirror layers reflect light generated in the active region back into the active region. The active layer and mirror layers form a semiconductor body. Contact layers are then formed on both sides of the body where the contact layers are electrically connected to the mirror layers, so that when a current is applied to the active region through the contact layers, the active region will generate substantially monochromatic and coherent radiation. The contact layers forming step is such that one of the contact layers so formed defines a hole therein, at least a portion of which is aligned with the active region to permit transmission therethrough of radiation transmitted through a mirror layer and generated in the active region.

Another aspect of the invention is directed toward an alternative method for fabricating a surface emitting semiconductor laser device. Oxygen ions are first blanket implanted into a substrate to a preset depth, and a hole is etched to into said substrate to a depth greater than said reset depth, said hole having a bottom surface in a portion of the substrate that has not been implanted with oxygen ions. The first mirror layer is grown on set bottom surface, where the thickness of the first mirror layer is such that the top surface of the first mirror layer is at about said preset depth and in contact with and surrounded by oxygen implanted portions of the substrate. On top of the first mirror layer is grown an active radiation generation layer, said active layer generating substantially monochromatic and coherent radiation in response to the passage of current through the active layer. The active layer is surrounded by oxygen implanted portions of the substrate. The oxygen implanted regions form an electrically insulating isolation region surrounding said active layer to confine current flow to said active layer. On top of the active layer is grown a second mirror semiconductor layer, said two mirror layers reflecting light generated in the active region back into the active region. The active and mirror layers form a semiconductor body. On both sides of the body are formed contact layers electrically connected to said mirror layers, so that when a current is applied to the active layer through the contact layers, the active layer will generate substantially monochromatic and coherent radiation. The contact layers forming step is such that at least one of the contact layers so formed defines a hole therein, at least a portion of which is aligned with the active region to permit transmission therethrough of radiation transmitted through a mirror layer and generated in the active region.

BRIEF DESCRIPTION OF THE DRAWINGS

Identical components in the different FIGS. are labeled by the same numerals.

DETAILED DESCRIPTION OF THE PREFERRED EMBODIMENT

Figure 1:
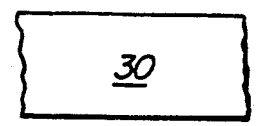
FIG. 1 is a cross-sectional view of a portion of a substrate useful for illustrating the invention.
Figure 6:
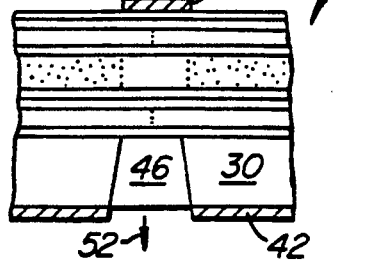
FIG. 6 is a cross-sectional view of the structure of FIG. 5 after contact layers have been formed on the second group of mirror layers and on the substrate, and after a hole has been etched into the substrate and the contact attached thereto through which light is emitted from the laser device to illustrate one embodiment of the invention.
Figure 7:
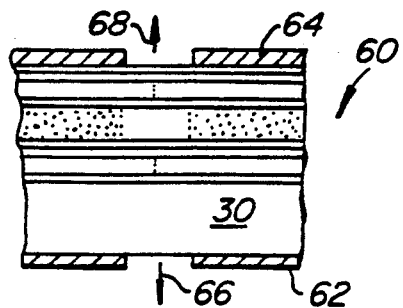
FIG. 7 shows the structure of FIG. 5 after contact layers have been formed on the second group of mirror layers and on the substrate where both contact layers have holes therein which are aligned with the active region, permitting light to be emitted on both sides of the structure to illustrate an alternative embodiment of the invention where the substrate is transparent to the lasing wavelength.

FIG. 1 is a cross-sectional view of a portion of a semiconductor substrate 30 useful for illustrating the invention. Substrate 30 may be composed of a compound III-V semiconductor material such as galium arsenide (GaAs). FIGS. 2-5 are cross-sectional views of the semiconductor structure that results when processing steps have been applied to substrate 30. FIGS. 6-7 are cross-sectional views of portions of two different surface emitting semiconductor laser diode structures that result from the various processing steps.

Figure 2:
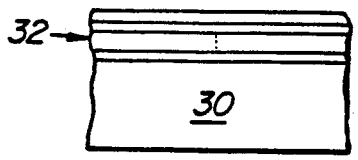
FIG. 2 is a cross-sectional view of the substrate of FIG. 1 after a group of mirror layers have been grown thereon.
Figure 3:
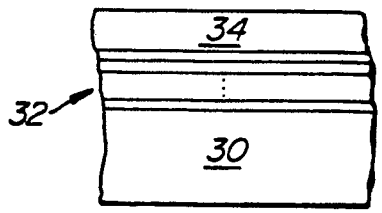
FIG. 3 is a cross-sectional view of the structure of FIG. 2 after an active layer have been grown thereon.
Figure 4:
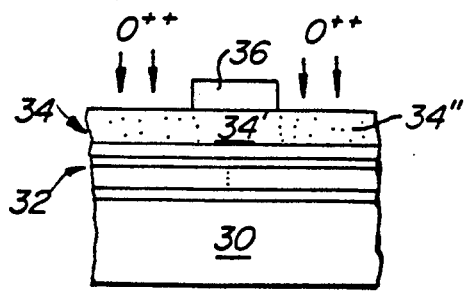
FIG. 4 is a cross-sectional view of the structure of FIG. 3, where the structure is masked and oxygen ions are implanted into the unmasked regions of the active layer to illustrate the invention.

As shown in FIG. 2, a first group of mirror layers 32 are epitaxially grown on top of substrate 30, where the mirror layers may be semiconductor-distributed Bragg reflector layers known to those skilled in the art. In the article by Tai, et al. referenced above, for example, such distributed Bragg reflector layers are composed of n-type twenty-two-pair $Al_{0.1}Ga_{0.9}As/AlAs$, or a fivepair p-type $Al_{0.1}Ga_{0.9}As/Al_{0.7}Ga_{0.3}As$ semiconductor-distributed Bragg reflector. As also disclosed in the Tai, et al. article, phase matching layers may also be employed in the growing of the mirror layers. An active layer 34 is then grown on top of the mirror layers as shown in FIG. 3. The active layer is composed of a sandwich of different layers of aluminum gallium arsenide of various compositions. Where the substrate 30 is made of a p-type material, the mirror layers 32 and the various layers in the active layer contiguous to mirror layers 32 are also of the p-type semiconductor material. The remaining layers within the active layer are made of n-type material forming a pn junction as is known to those skilled in the art. In the Tai, et al. article referenced above, the active layer is composed of the p-type aluminum gallium arsenide layer, a p-type gallium arsenide layer and an n-type aluminum gallium arsenide layer. While the composition described by Tai et al. may be used for the invention, it will be understood that the active layer of this application may be composed of many other types of compositions which are also within the scope of the invention.

A mask 36 is formed on a portion of the active layer 34 to define an active region 34'. As explained above, it is desirable for current flow and induction of light emission to be limited to a small area of the active layer. The size of the mask 36 is chosen to define an active region 34' which is of the desired dimensions. Oxygen ions are then implanted into the unmasked portions of the active layer 34, where the ion-implanted portions of the active layer are shown shaded by dots. The portions of the active layer 34 implanted with oxygen ions form an insulating isolation region 34" surrounding the active region 34'. Mask 36 is removed and the second group of mirror layers 38 are grown on top of the active layer 34, so that the oxygen ion implantation can be followed by epitaxial regrowth to complete the fabrication of the device. In the example illustrated above, where substrate 30 is made of a p-type material, mirror layers 38 will be composed of n-type material. As in the case of mirror layers 32, mirror layers 38 may also be composed of distributed Bragg reflector layers of various compositions described above.

Contacts 42 and 44 are then formed respectively on the substrate and second group of mirror layers 38. Then a through hole is etched through contact layer 42 and substrate 30 reaching the first group of mirror layers 32, to permit radiation generated in the active region 34' to be emitted as monochromatic and coherent radiation. As is known to those skilled in the art, the two groups of mirrors 32, 38 are not perfect reflectors, and each group will permit a small percentage of light generated in the active region to escape therethrough. Since the active region 34' is typically small, it is preferable for the two groups of mirror layers to have high reflectivity, thereby reflecting most of the light generated in the active region back into the active region for the purpose of inducing more light emission in the small region. The few percent of the light that escapes through the mirror layers are adequate for various applications of the laser device. Contacts 42, 44 may be made of metal or a heavily-doped p- or n-type material that match the type of doping in substrate 30 and mirror layers 38.

In the configuration of FIG. 6, surface emitting laser 50 emits light only in one direction, that is, through hole 46 and a long arrow 52. Where it is desirable for the laser to emit light in two opposite directions, holes may be etched into both the top and bottom contacts as shown in FIG. 7. As shown in FIG. 7, holes are etched into contacts 62 and 64 of laser device 60 so that light may be emitted along directions 66 and 68. As shown in FIG. 7, no hole is etched through substrate 30. No hole needs to be etched in the substrate where the substrate is composed of a material that does not significantly absorb light generated in the active region. Thus where substrate 30 is made of gallium arsenide, and the lasing wavelength is greater than 0.9 micron, the substrate will be substantially transparent, so that no hole needs to be etched into the substrate. Where the lasing wavelength is such that the light generated is absorbed by the substrate, a hole such as hole 46 will need to be etched into the substrate as shown in FIG. 6.

In both surface emitting laser diodes 50 and 60 shown in FIGS. 6-7, the oxygen ion-implanted isolation region 34" is electrically insulating and therefore restricts current flow through the active layer 34 only through the active region 34'. Hence when an electrical potential is applied between contacts 42, 44 or 62, 64, current will flow between the contacts only through the active region 34' of the active layer. This effectively forces the currents to be concentrated in a small region to increase the efficiency measured in terms of radiation generated per unit current applied to the laser device.

As explained above, the oxygen-implanted isolation region 34" surrounds and restricts current flow through the active layer 34'. The isolation ring within the mirror layers disclosed by Tai, et al. in the article referenced above may also be incorporated in addition to oxygen-implanted isolation region 34" to further restrict current flow. Thus, without Tai et al.'s structure, after the current has passed through active region 34', it will diverge at least somewhat when it reaches either one of the two groups of mirror layers 32, 38. By incorporating the isolation ring as disclosed by Tai, et al. in one of the two groups of mirror layers of the devices 50 or 60, current flow may be restricted to an even smaller portion within the active region. The steps for implementing such isolation ring are illustrated in FIGS. 8-12.

Figure 5:
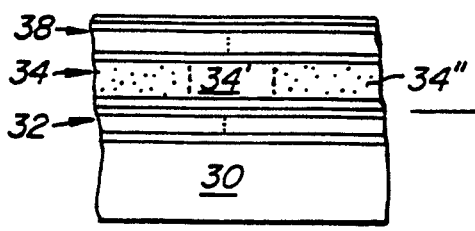
FIG. 5 is a cross-sectional view of the structure of FIG. 4 after the mask has been removed and a second group of mirror layers grown on top of the active layer.
Figure 8:
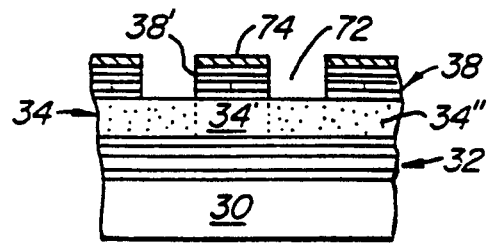
FIG. 8 shows the structure of FIG. 5, after an annular-shaped well has been formed in the second group of mirror layers with the aid of a mask, where the annular well surrounds an island portion of the second group of mirror layers.
Figure 9:
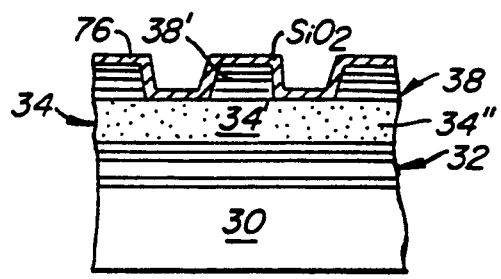
FIG. 9 shows the structure of FIG. 8 after the mask has been removed and a layer of silicon dioxide formed into the well as well as the remaining surfaces of the second group of mirror layers.
Figure 10:
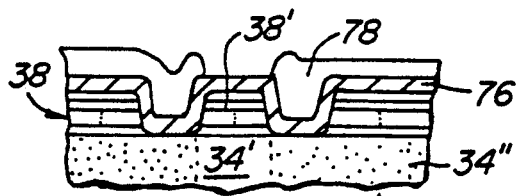
FIG. 10 shows a portion of the structure of FIG. 9 with a mask formed on top of the silicon dioxide layer, exposing only the portion of the silicon dioxide layer on top of the island portion of the second group of mirror layers.
Figure 11:
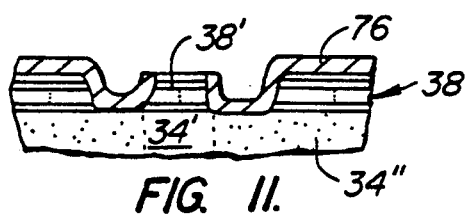
FIG. 11 shows the structure of FIG. 10 with the exposed portion of the silicon dioxide etched away and the mask removed.
Figure 12:
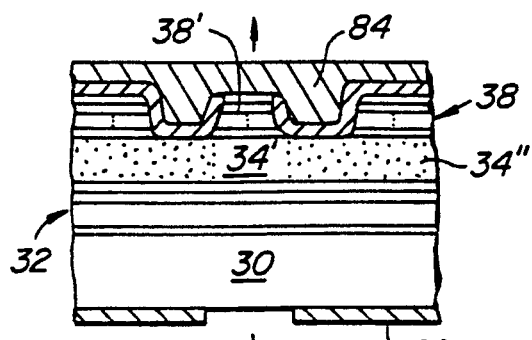
FIG. 12 is a cross-sectional view the device of FIG. 11, after contact layers have been formed on both sides of the device, where the contact layer in contact with the substrate has a hole therein to permit light emission therethrough.

In order to implement the isolation ring, one will start off with the structure shown in FIG. 5. An annular well 72 is etched through the second group of mirror layers 38 with the aid of a mask 74 as shown in FIG. 8. The annular well 72 surrounds an island portion 38' of the second group of mirror layers 38. A layer of silicon dioxide is then deposited onto the surfaces of well 72 as well as the top surfaces of island portion 38' and the remainder of the second group of mirror layers 38 as shown in FIG. 9. In FIG. 10, only the top portion of the active layer 34 and all the layers above it are shown to simplify the drawing. As shown in FIG. 10, a mask 78 is formed on top of the silicon dioxide layer 76, leaving exposed only the portion of layer 76 on top of the island portion 38'. Such exposed portion of the silicon dioxide is etched away to expose the top surface of the island portion 38' as shown in FIG. 11, where mask 78 has also been removed. Contact layers 82, 84 are then formed on substrate 30 and on top of the silicon dioxide layer 76 and the top surface of the second group of mirror layers 38' as shown in FIG. 12. Hence the active region 34' is isolated from contact 84 by silicon dioxide layer 76 except at the interface between the region 38' of the group of layers 38 and contact 84. Again a hole is provided in contact 82 to permit the transmission of light generated in the active region 34'. Thus by further confining the area in the second group of mirror layers 38 through which current may flow between contact 84 and active region 34', current flow through the active region is further restricted to improve the efficiency of the device. While in FIG. 12, no hole is etched in the substrate 30, it will be understood that such hole may be provided if the substrate is not transparent to the light generated in the active region.

Figure 13:
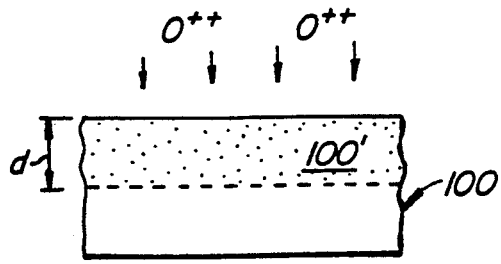
FIG. 13 is a cross-sectional view of a portion of a substrate, into which oxygen ions have been implanted to a preset depth to illustrate an alternative embodiment of the invention.
Figure 14:
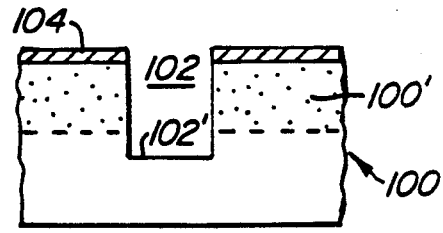
FIG. 14 shows the structure of FIG. 13 after a well has been etched into the substrate depth beyond the preset depth of oxygen implantation with the aid of a mask.
Figure 15:
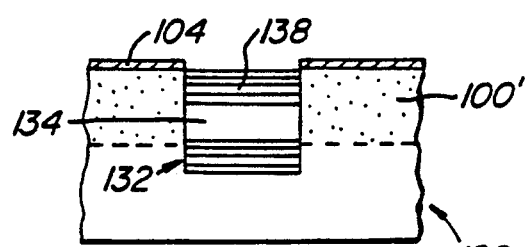
FIG. 15 shows the structure of FIG. 14 after a first group of mirror layers, an active layer, a second group of mirror layers have been formed in the well and the oxygen implanted substrate.

FIGS. 13-16 illustrate another embodiment of the invention. FIG. 13 is a cross-sectional view of a portion of a semiconductor substrate 100 into which oxygen ions have been blanket-implanted to a present depth d as shown in FIG. 13, where the portion of the substrate into which oxygen has been implanted is labeled 100' forms an electrically insulating isolation layer. A well 102 is etched into the isolation layer 100' to a depth greater than d as shown in FIG. 14, with the aid of a dielectric mask 104. Therefore the side walls of well 102 are surrounded by the isolation portion 100', and the bottom surface 102' of the well is situated in the portion of the substrate 100 into which oxygen ions have not been implanted. A first group of mirror layers 132 are then epitaxially grown on top of the bottom surface 102' of well 102, and then an active layer 134 is grown on top of the group 132 of mirror layers. Thereafter a second group of mirror layers 138 are grown on top of the active region.

Figure 16:
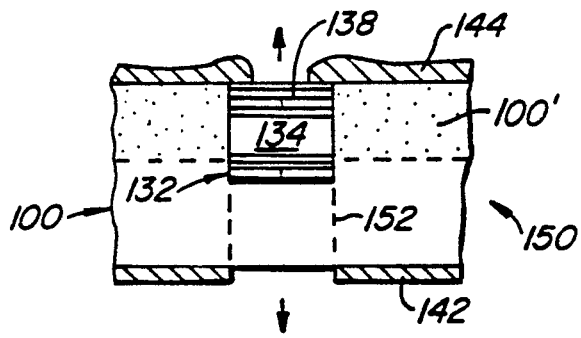
FIG. 16 shows the structure of FIG. 15 with contact layers formed on both sides of the structure with holes therein to permit light emission through both sides of the structure.

The dielectric layer is then removed and contacts 142, 144 are then formed thus before and shown in FIG. 16. As shown in FIG. 16, holes are provided in both contacts to permit light emission from both sides of the laser device 150. Again if the substrate is not transparent to the light generated in the active region, a hole may be etched into the substrate 100 thus shown by dotted lines 152.

The invention has been described above by reference to various embodiments. It will be understood that different modifications may be made without departing from the scope of the invention which is to by limited only by the appended claims.

What is claimed is:

1. A method for fabricating a surface emitting semiconductor laser device comprising:
   epitaxially growing a mirror layer on a substrate and, on top of said mirror layer, an active radiation generating layer, said active layer generating substantially monochromatic and coherent radiation in response to passage of current through said active layer;
   implanting oxygen ions into said active layer in regions surrounding an active region of said active layer,
   rapidly thermally annealing the epitaxial active layer, thereby activating the oxygen ions and forming an electrically insulating isolation region within said active layer and surrounding said active region to confine current flow through said active layer to said active region;
   subsequently growing on said active layer a second mirror reflector semiconductor layer, said mirror layers reflecting light generated in the active region back into the active region, said active layer and mirror layers forming a semiconductor body; and
   forming contact layers on both sides of the body and electrically connected to said mirror layers, so that when a current is applied to the active region through the contact layers, the active region will generate substantially monochromatic radiation;
   wherein at least one of said contact layers so formed defines a hole therein at least a portion of which is aligned with the active region to permit transmission therethrough of radiation transmitted through a mirror layer and generated in the active region.

2. The method of claim 1, wherein said substrate is capable of absorbing radiation generated by the active region, said method further comprising etching into said substrate a hole at least a portion of which is aligned with the hole in the contact layer and the active region to permit transmission therethrough of radiation transmitted through a mirror layer and generated in the active region.

3. The method of claim 1, further comprising masking a selected area of the active layer before the oxygen implanting step to define the active region.

4. The method of claim 1, further comprising, before the contact layers are formed, forming in at least one of said mirror layers an electrically insulating ring region surrounding an electrically conducted mirror reflector region of said at least one mirror layer, wherein at least a portion of said electrically conducting mirror reflector region is aligned with said hole and the active region, said insulating ring region causing current flow through said at least one of said mirror layers to be to confined to said mirror reflector region.

5. The method of claim 4, said ring region forming step including:
   etching a ring shaped cavity into said at least one of said mirror layers, said cavity surrounding and defining said electrically conducting mirror reflector region;
   forming an insulating layer on said at least one of said mirror layers so that an electrically insulating ring region is formed in said cavity; and
   etching away a portion of said insulating layer in contact with said active region outside the cavity.

* * * * *